(12) United States Patent
Gotou et al.

(10) Patent No.: US 11,595,138 B2
(45) Date of Patent: Feb. 28, 2023

(54) MONITORING DEVICE, MOTOR DRIVING APPARATUS, AND MONITORING METHOD

(71) Applicant: FANUC CORPORATION, Minamitsuru-gun (JP)

(72) Inventors: Daishi Gotou, Yamanashi-ken (JP); Masaya Tateda, Yamanashi-ken (JP)

(73) Assignee: FANUC CORPORATION, Yamanashi-ken (JP)

( * ) Notice: Subject to any disclaimer, the term of this patent is extended or adjusted under 35 U.S.C. 154(b) by 266 days.

(21) Appl. No.: 17/129,264

(22) Filed: Dec. 21, 2020

(65) Prior Publication Data
US 2021/0194604 A1 Jun. 24, 2021

(30) Foreign Application Priority Data
Dec. 23, 2019 (JP) ............................. JP2019-231439

(51) Int. Cl.
| | | |
|---|---|---|
| H03K 5/01 | (2006.01) | |
| H04B 17/18 | (2015.01) | |
| H04L 7/00 | (2006.01) | |
| H02P 23/00 | (2016.01) | |

(52) U.S. Cl.
CPC ............. *H04B 17/18* (2015.01); *H02P 23/00* (2013.01); *H04L 7/0008* (2013.01)

(58) Field of Classification Search
CPC . H02P 23/00; H02P 29/024; G01R 31/31727; G06F 11/3058; G06F 1/14
See application file for complete search history.

(56) References Cited

U.S. PATENT DOCUMENTS

| | | | |
|---|---|---|---|
| 2004/0183488 A1* | 9/2004 | Fuse .......................... | H02P 6/16 318/400.11 |
| 2007/0205734 A1* | 9/2007 | Miyazawa ............. | G01L 25/003 318/432 |
| 2014/0102219 A1 | 4/2014 | Kuwahara et al. | |

FOREIGN PATENT DOCUMENTS

| | | |
|---|---|---|
| JP | 2004-173380 A | 6/2004 |
| JP | 2008-105109 A | 5/2008 |
| WO | WO 2012/176357 A1 | 12/2012 |

* cited by examiner

*Primary Examiner* — Muhammad S Islam
(74) *Attorney, Agent, or Firm* — McGinn I.P. Law Group, PLLC.

(57) ABSTRACT

A monitoring device includes: an acquisition unit for acquiring a clock signal output from a communication circuit that outputs the clock signal; and a monitoring unit for analyzing the waveform of the clock signal acquired by the acquisition unit, based on a predetermined reference clock signal having a period equal to or shorter than a period of the clock signal to thereby determine whether or not there is a sign of malfunction in the communication circuit.

10 Claims, 8 Drawing Sheets

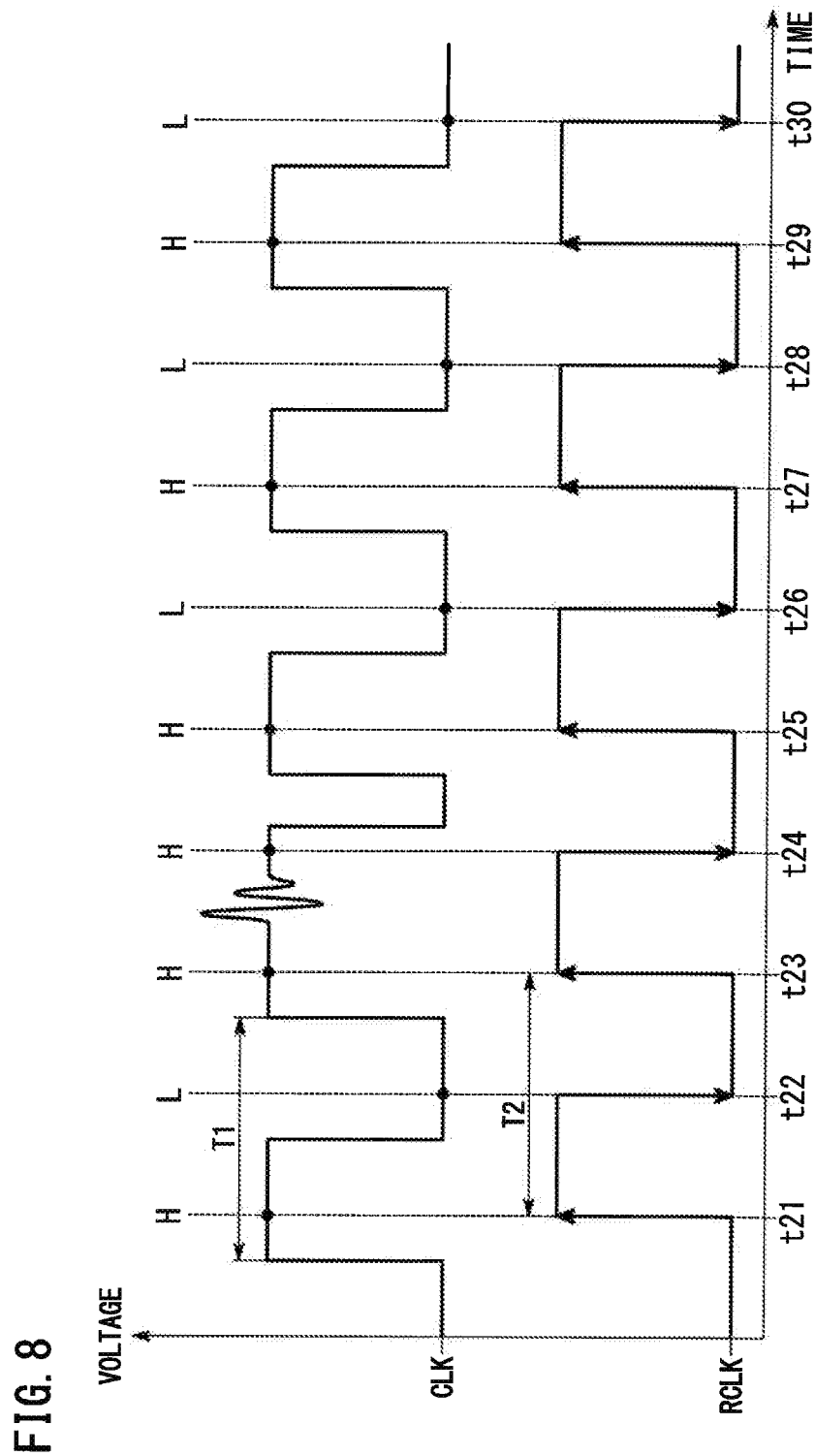

MONITORING DEVICE, MOTOR DRIVING APPARATUS, AND MONITORING METHOD

CROSS-REFERENCE TO RELATED APPLICATION

This application is based upon and claims the benefit of priority from Japanese Patent Application No. 2019-231439 filed on Dec. 23, 2019, the contents of which are incorporated herein by reference.

BACKGROUND OF THE INVENTION

Field of the Invention

The present invention relates to a monitoring device, a motor driving apparatus, and a monitoring method.

Description of the Related Art

Japanese Laid-Open Patent Publication No. 2004-173380 discloses a motor control device including a plurality of microcomputers for controlling motors. In Japanese Laid-Open Patent Publication No. 2004-173380, each microcomputer reads the electric current value of the associated motor at a timing that is shifted from the timings when switching signals are output from the other microcomputers. Thus, in Japanese Laid-Open Patent Publication No. 2004-173380, the influence of switching noise can be avoided.

SUMMARY OF THE INVENTION

However, Japanese Laid-Open Patent Publication No. 2004-173380 cannot detect a sign of malfunction of the communication circuit due to the influence of noise and the like.

It is therefore an object of the present invention to provide a monitoring device, a motor driving apparatus, and a monitoring method, capable of detecting a sign of malfunction in a communication circuit.

According to one aspect of the present invention, there is provided a monitoring device, including: an acquisition unit configured to acquire a clock signal output from a communication circuit that outputs the clock signal; and a monitoring unit configured to analyze a waveform of the clock signal acquired by the acquisition unit, based on a predetermined reference clock signal having a period equal to or shorter than a period of the clock signal, and thereby determine whether or not there is a sign of malfunction in the communication circuit.

According to another aspect of the present invention, there is provided a motor driving apparatus including the above monitoring device, the motor driving apparatus further including: an inverter configured to supply an electric current to a motor; a current detector configured to detect the electric current supplied to the motor; and a control unit configured to control the inverter. In the motor driving apparatus, the communication circuit is configured to output the clock signal and data corresponding to a detection signal detected by the current detector, to the control unit, and the control unit is configured to output the reference clock signal to the monitoring unit.

According to another aspect of the present invention, there is a monitoring method including: an acquisition step of, with an acquisition unit, acquiring a clock signal output from a communication circuit that outputs the clock signal; and a monitoring step of, with a monitoring unit, determining whether or not there is a sign of malfunction in the communication circuit, by analyzing a waveform of the clock signal, based on a predetermined reference clock signal having a period that is equal to or shorter than a period of the clock signal.

According to the present invention, it is possible to provide a monitoring device, a motor driving apparatus, and a monitoring method, capable of grasping a sign of malfunction in a communication circuit.

The above and other objects, features, and advantages of the present invention will become more apparent from the following description when taken in conjunction with the accompanying drawings in which a preferred embodiment of the present invention is shown by way of illustrative example.

BRIEF DESCRIPTION OF THE DRAWINGS

FIG. 3 is a time chart showing an example of a state in which the voltage level of the clock signal is kept at a high level due to the influence of disturbance noise, or the like;

FIG. 4 is a time chart showing an example of a state in which the voltage level of the clock signal is kept at a low level due to the influence of aging deterioration of a communication circuit, or the like;

FIG. 8 is a time chart showing an example of a state in which the voltage level of the clock signal is kept at the high level due to the influence of disturbance noise, or the like.

DESCRIPTION OF THE PREFERRED EMBODIMENTS

A monitoring device, a motor driving apparatus, and a monitoring method according to preferred embodiments of the present invention will be described, in detail, below with reference to the accompanying drawings.

Embodiment

Figure 1:
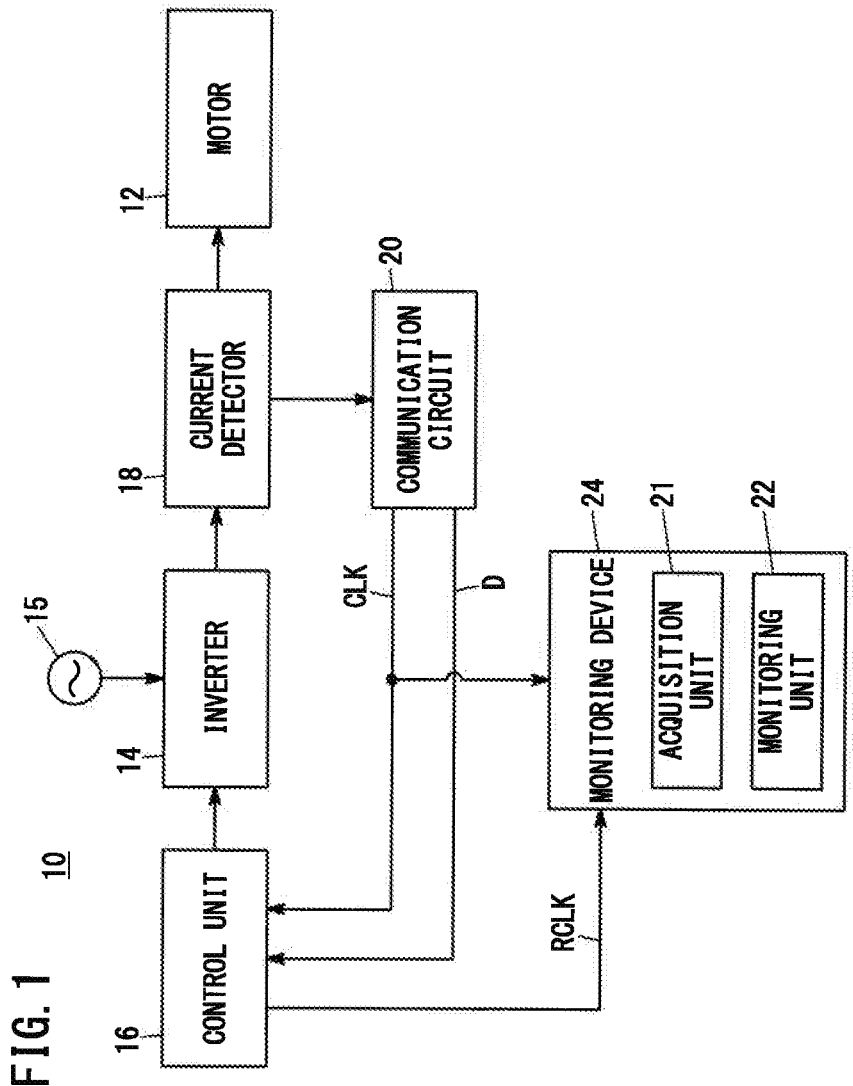
FIG. 1 is a diagram showing a configuration of a motor driving apparatus according to an embodiment.

A monitoring device, a motor driving apparatus, and a monitoring method according to an embodiment will be described with reference to FIGS. 1 to 6. FIG. 1 is a diagram showing a configuration of a motor driving apparatus according to the present embodiment.

A motor driving apparatus 10 according to the present embodiment can drive a motor 12.

The motor driving apparatus 10 includes an inverter (inverter unit) 14 that supplies electric current to the motor 12. The inverter 14 includes an unillustrated converter circuit, an unillustrated capacitor, and an unillustrated inverter circuit. The converter circuit converts AC (alternate current) voltage supplied from an AC power supply 15 into DC (direct current) voltage. The capacitor smooths the DC voltage rectified by the rectifier circuit provided in the converter circuit. The inverter circuit can drive the motor 12 by converting the DC voltage supplied from the converter circuit into an AC voltage and supplying the AC voltage to the motor 12.

The motor driving apparatus 10 further includes a control unit 16. The control unit 16 controls the entire motor driving apparatus 10. The control unit 16 may be configured by, for example, a processor such as a CPU (Central Processing Unit), but is not limited to this. The control unit 16 can control the inverter 14. The control unit 16 can drive the motor 12 by appropriately switching the switching elements (power elements) provided in the inverter circuit and the like. The control unit 16 may output an after-mentioned reference clock signal RCLK to a monitoring unit 22, which will be described later.

The motor driving apparatus 10 further includes a current detector 18. The current detector 18 is disposed between the inverter 14 and the motor 12. The current detector 18 detects an electric current supplied from the inverter 14 to the motor 12. The current detector 18 outputs a detection signal corresponding to the current supplied from the inverter 14 to the motor 12, to a communication circuit 20, which will be described later.

The motor driving apparatus 10 further includes a communication circuit 20. The communication circuit 20 outputs data D corresponding to the detection signal supplied from the current detector 18, to the control unit 16. That is, the communication circuit 20 outputs the data D indicating the current supplied to the motor 12 from the inverter 14, to the control unit 16. The communication circuit 20 outputs the data D to the control unit 16 based on a clock signal CLK. The communication circuit 20 outputs not only the data D but also the clock signal CLK, to the control unit 16.

The motor driving apparatus 10 further includes a monitoring device 24. The monitoring device 24 includes an acquisition unit 21 and a monitoring unit 22. The acquisition unit 21 and the monitoring unit 22 can be configured by, for example, a processor such as a CPU, but are not limited to this. The acquisition unit 21 can acquire the clock signal CLK output from the communication circuit 20. The monitoring unit 22 can analyze the waveform of the clock signal CLK acquired by the acquisition unit 21. The monitoring unit 22 can analyze the waveform of the clock signal CLK by using a predetermined reference clock signal RCLK having a period T2 (see FIG. 2), which is equal to or shorter than the period T1 of the clock signal CLK (see FIG. 2). The reference clock signal RCLK can be supplied from, for example, the control unit 16, but is not limited to this.

When there is a sign of malfunction in the communication circuit 20 due to the influence of disturbance noise, aging deterioration of the communication circuit 20, and the like, the waveform of the clock signal CLK may get into a state different from the normal state. The monitoring unit 22 can analyze the waveform of the clock signal CLK to determine whether or not there is a sign of malfunction in the communication circuit 20. When the analyzed waveform of the clock signal CLK is different from a predetermined basic waveform, the monitoring unit 22 determines that there is a sign of malfunction in the communication circuit 20. The basic waveform is a waveform of the clock signal CLK in the normal state, that is, the waveform of the clock signal CLK that is not affected by disturbance noise or the like.

The monitoring unit 22 can analyze the waveform of the clock signal CLK by observing (detecting) the voltage levels of the clock signal CLK at rising timings or falling timings of the reference clock signal RCLK. That is, the monitoring unit 22 observes the voltage level of the clock signal CLK at rising or falling timings of the reference clock signal RCLK, and thereby can determine whether or not the analyzed waveform of the clock signal CLK is different from the predetermined basic waveform.

Figure 2:
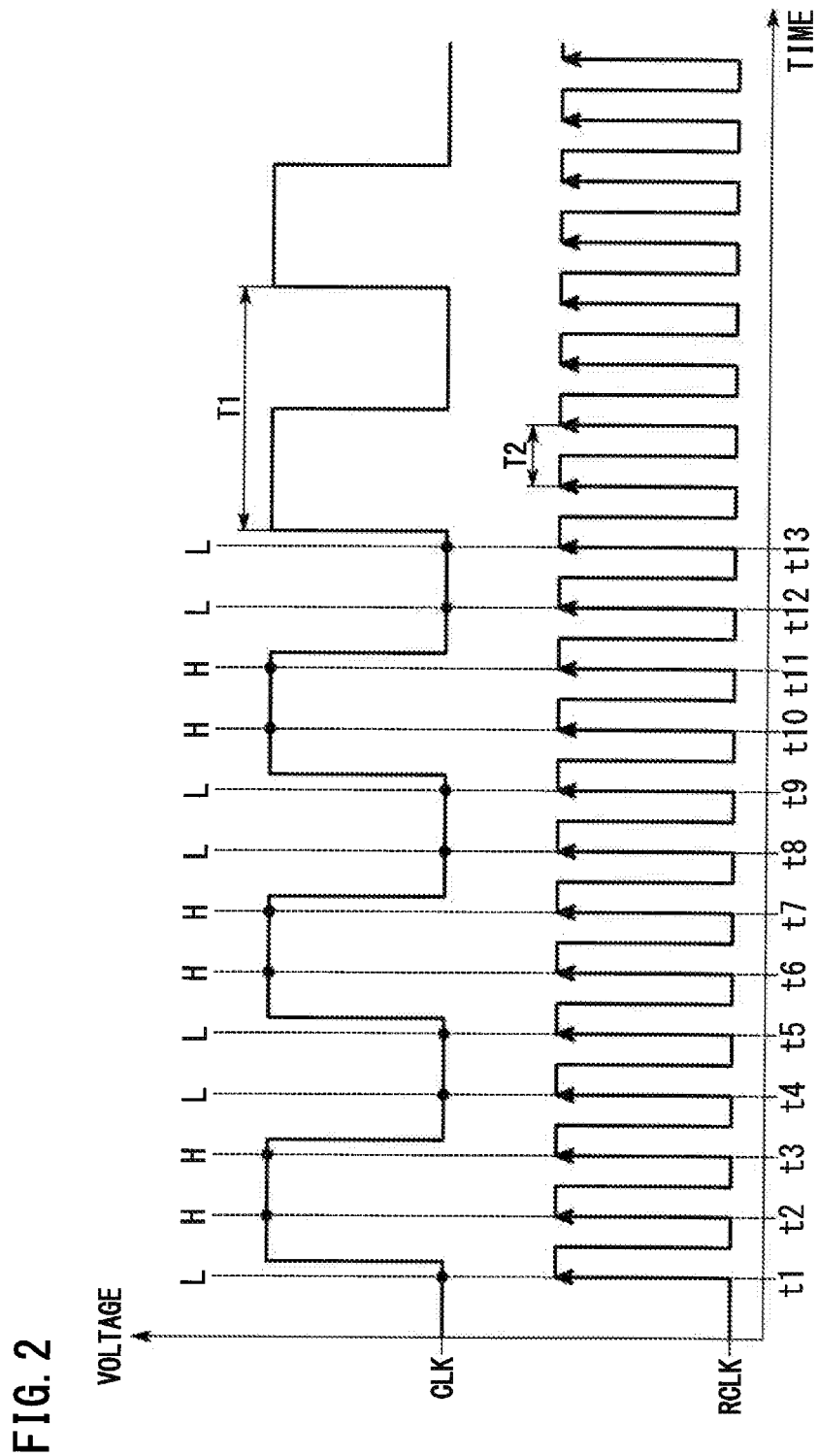
FIG. 2 is a time chart showing a clock signal and a reference clock signal.

FIG. 2 is a time chart showing the clock signal and the reference clock signal. FIG. 2 shows an example in which the period T2 of the reference clock signal RCLK is set shorter than the period T1 of the clock signal CLK. Here, for description convenience, an example is shown in which the period T2 of the reference clock signal RCLK is one-fourth of the period T1 of the clock signal CLK. From the viewpoint of analyzing the clock signal CLK with higher accuracy, it is preferable that the period T2 of the reference clock signal RCLK is sufficiently shorter than the period T1 of the clock signal CLK. FIG. 2 shows an example in which the voltage level of the clock signal CLK is observed at rising timings of the reference clock signal RCLK.

In the example shown in FIG. 2, the reference clock signal RCLK rises at timing t1. When the timing is generally described, a reference numeral t is used, and when individual timings are described, reference numerals t1, t2, t3, . . . are used. The monitoring unit 22 observes (detects) the voltage level of the clock signal CLK at the timing t1. In the example shown in FIG. 2, the voltage level of the clock signal CLK at the timing t1 is L, i.e., a low level.

The reference clock signal RCLK rises at a timing t2, which is a timing occurring one cycle (period T2) after the timing t1. The monitoring unit 22 observes the voltage level of the clock signal CLK at the timing t2. In the example shown in FIG. 2, the voltage level of the clock signal CLK at the timing t2 is H, i.e., a high level.

The reference clock signal RCLK rises at a timing t3, which is a timing occurring one period T2 after the timing t2. The monitoring unit 22 observes the voltage level of the clock signal CLK at the timing t3. In the example shown in FIG. 2, the voltage level of the clock signal CLK at the timing t3 is H.

The reference clock signal RCLK rises at a timing t4, which is a timing occurring one period T2 after the timing t3. The monitoring unit 22 observes the voltage level of the clock signal CLK at the timing t4. In the example shown in FIG. 2, the voltage level of the clock signal CLK at the timing t4 is L.

The reference clock signal RCLK rises at a timing t5, which is a timing occurring one period T2 after the timing t4. The monitoring unit 22 observes the voltage level of the clock signal CLK at the timing t5. In the example shown in FIG. 2, the voltage level of the clock signal CLK at the timing t5 is L.

After this, the monitoring unit 22 also observes the voltage level of the clock signal CLK at rising timings t6, t7, t8, and t9 of the reference clock signal RCLK in the same manner as described above. In the example shown in FIG. 2, the voltage levels of the clock signal CLK at the timings t6, t7, t8, and t9 are H, H, L, and L, respectively.

Thereafter, the monitoring unit 22 also observes the voltage levels of the clock signal CLK at rising timings t10, t11, t12, and t13 of the reference clock signal RCLK in the same manner as described above. In the example shown in FIG. 2, the voltage levels of the clock signal CLK at the timings t10, t11, t12, and t13 are H, H, L, and L, respectively.

When the period T2 of the reference clock signal RCLK is one-fourth of the period T1 of the clock signal CLK, the voltage level of the clock signal CLK observed at the rising timings t of the reference clock signal RCLK repeats the above-described cycle of H, H, L, L. When the voltage level of the clock signal CLK sequentially observed at the rising timings t of the reference clock signal RCLK repeats the cycle of H, H, L, L, the monitoring unit 22 can determine that the waveform of the clock signal CLK is the same as the predetermined basic waveform.

There are cases where the voltage level of the clock signal CLK may be kept at the high level or the low level due to the influence of disturbance noise or the like. Since the communication circuit 20 outputs data D according to the clock signal CLK, if the clock signal CLK is kept at the high level or the low level, there is a risk that the data D cannot be output correctly. That is, when the voltage level of the clock signal CLK is kept at the high level or the low level, there is a possibility that the communication circuit 20 is malfunctioning.

Figure 3:
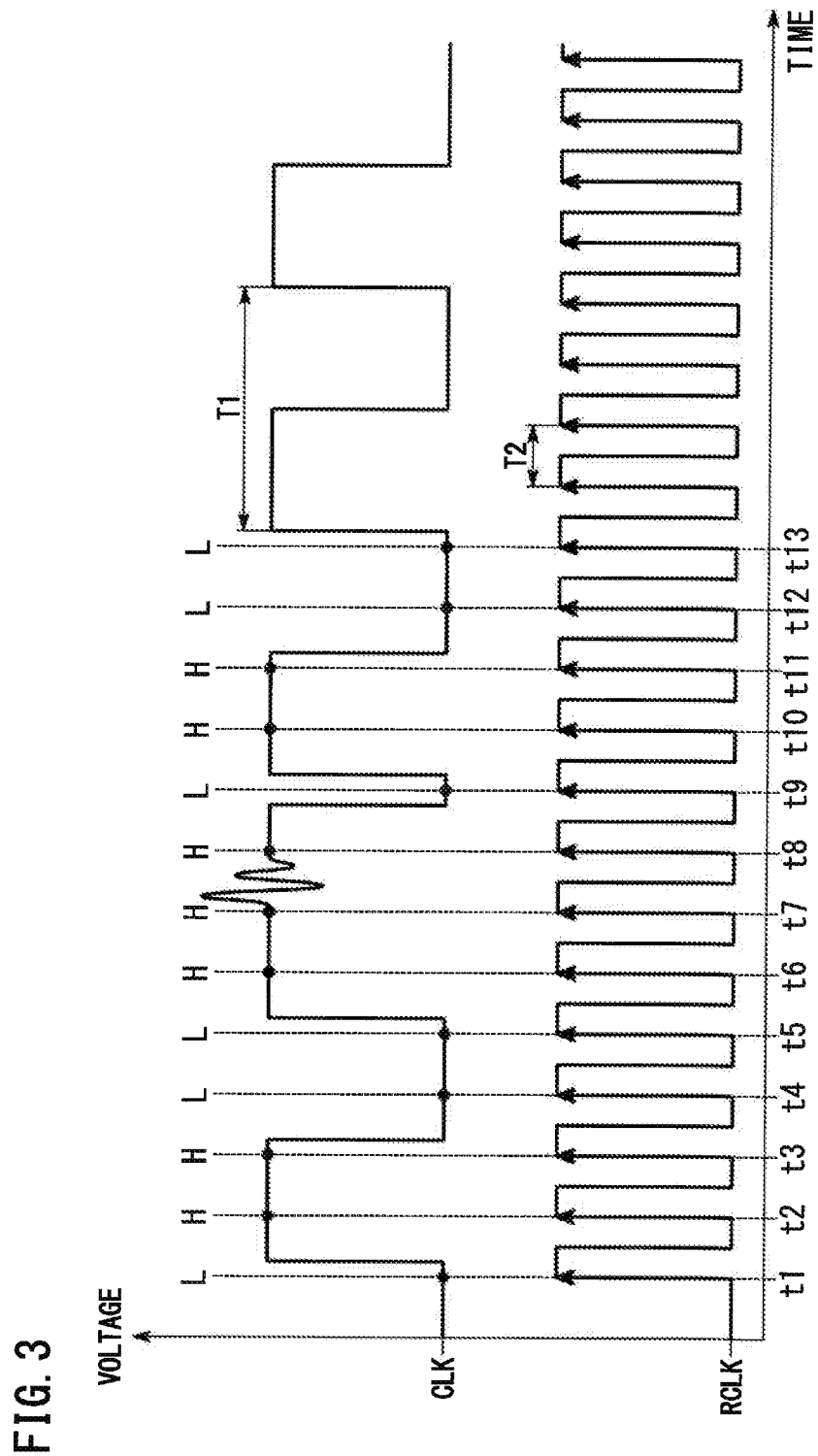

FIG. 3 is a time chart showing an example of a state in which the voltage level of the clock signal is kept at the high level due to the influence of disturbance noise or the like. Though FIG. 3 shows an example of a state in which the voltage level of the clock signal CLK is kept at the high level due to the influence of disturbance noise or the like, the clock signal CLK may be kept at the low level due to the influence of a disturbance noise or the like. In the example shown in FIG. 3, the observed voltage levels of the clock signal CLK at the timings t1 to t7 are the same as those in the example shown in FIG. 2. However, in the example shown in FIG. 3, the level of the clock signal CLK observed at the timing t8 is H. As described above, in the example shown in FIG. 2, the level of the clock signal CLK observed at the timing t8 is L. Thus, in the example shown in FIG. 3, the level of the clock signal CLK observed at the timing t8 differs from that in the example shown in FIG. 2. The level of the clock signal CLK observed at the timing t8 in the case shown in FIG. 3 becomes different from the case shown in FIG. 2 because of the influence of disturbance noise or the like that occurred during a time period between the timing t7 and the timing t8 in the example shown in FIG. 3. In the example shown in FIG. 3, the voltage levels of the clock signal CLK observed after the timing t9 are the same as those in the example shown in FIG. 2.

In the example shown in FIG. 2, the voltage levels of the clock signals CLK observed at the timings t6 to t9 are H, H, L, L, respectively. On the other hand, in the example shown in FIG. 3, the voltage levels of the clock signals CLK observed at the timings t6 to t9 are H, H, H, L, respectively. That is, in the example shown in FIG. 3, the waveform of the clock signal CLK is not the same as the predetermined basic waveform. Since the waveform of the clock signal CLK is not the same as the predetermined basic waveform, the monitoring unit 22 determines that there is a sign of malfunction in the communication circuit 20.

Figure 4:
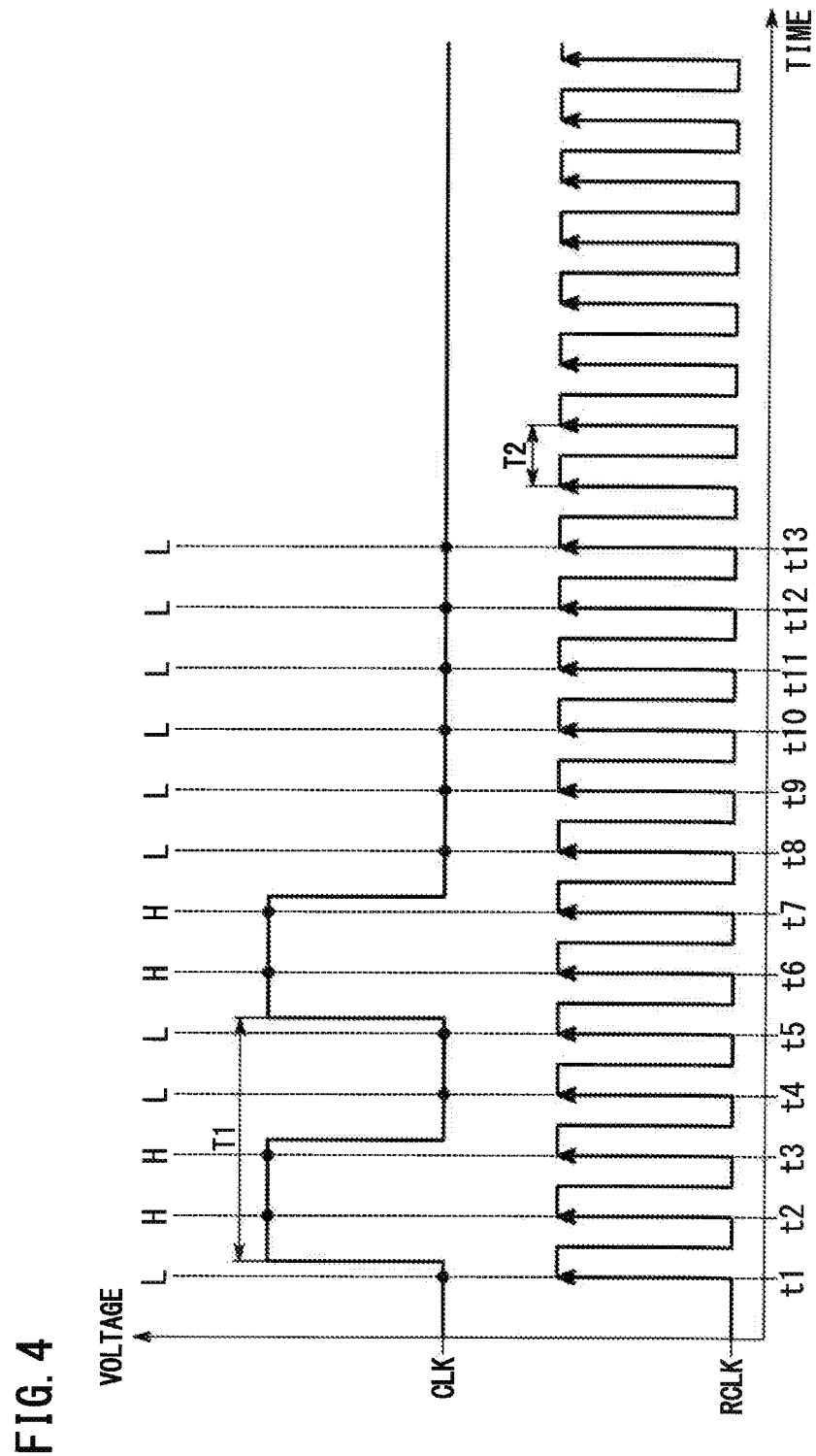

FIG. 4 is a time chart showing an example of a state in which the voltage levels of the clock signal are kept at the low level due to the influence of aging deterioration of the communication circuit or the like. Though FIG. 4 shows an example in which the voltage levels of the clock signal CLK are kept at the low level due to the influence of aging deterioration of the communication circuit 20 or the like, there are cases where the voltage levels of the clock signal CLK are kept at the high level due to aging deterioration of the communication circuit 20 or other. In the example shown in FIG. 4, the voltage levels of the clock signal CLK observed at the timings t1 to t9 are the same as those in the example shown in FIG. 2. However, in the example shown in FIG. 4, the levels of the clock signal CLK observed at the timing t10 and thereafter are L, L, L, L, . . . . As described above, in the example shown in FIG. 2, the levels of the clock signal CLK observed at the timing t10 and thereafter are H, H, L, L, . . . . Thus, in the example shown in FIG. 4, the levels of the clock signal CLK observed at the timing t10 and thereafter are different from those in the example shown in FIG. 2. The levels of the clock signal CLK observed at the timing t10 and thereafter become different from the cases shown in FIGS. 2 and 3 because the influence of aging deterioration of the communication circuit 20 or the like has occurred after the timing t8 in the example shown in FIG. 4.

In the example shown in FIG. 2, the voltage levels of the clock signal CLK observed at the timings t10 to t13 are H, H, L, L, respectively. On the other hand, in the example shown in FIG. 4, the voltage levels of the clock signal CLK observed at the timings t10 to t13 are L, L, L, L, respectively. That is, in the example shown in FIG. 4, the waveform of the clock signal CLK is not the same as the predetermined basic waveform. Since the waveform of the clock signal CLK is not the same as the predetermined basic waveform, the monitoring unit 22 determines that there is a sign of malfunction in the communication circuit 20.

Figure 5:
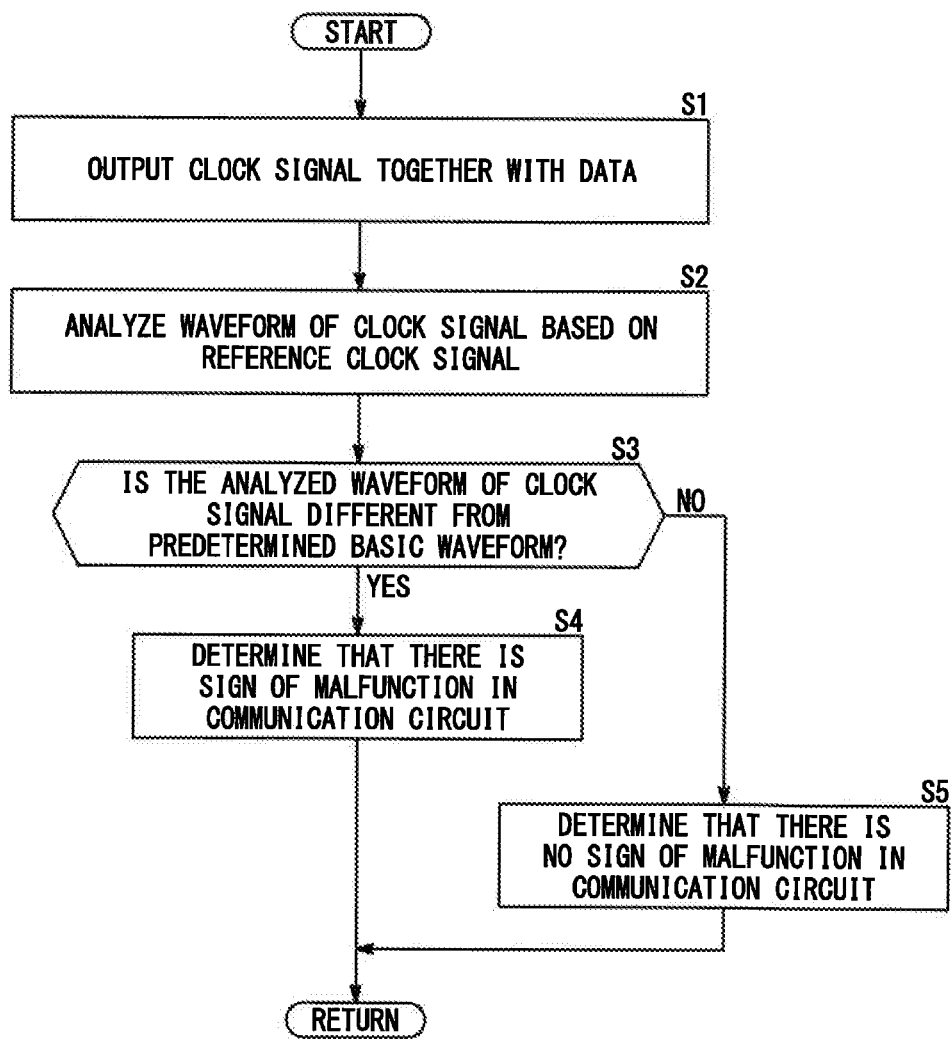
FIG. 5 is a flowchart showing an operational example of a monitoring device according to the embodiment.

An operational example of the monitoring device 24 according to the present embodiment will be described with reference to FIG. 5. FIG. 5 is a flowchart showing an operational example of the monitoring device according to the present embodiment.

At step S1, the communication circuit 20 outputs data D according to the clock signal CLK and also outputs the clock signal CLK. Step S1 is continuously performed.

At step S2, the monitoring unit 22 analyzes the waveform of the clock signal CLK based on the reference clock signal RCLK. Step S2 is continuously performed.

At step S3, the monitoring unit 22 determines whether or not the analyzed waveform of the clock signal CLK is different from the predetermined basic waveform. When the analyzed waveform of the clock signal CLK is different from the predetermined basic waveform (YES at step S3), the process proceeds to step S4. When the analyzed waveform of the clock signal CLK is not different from the predetermined basic waveform (NO at step S3), the process proceeds to step S5.

At step S4, the monitoring unit 22 determines that there is a sign of malfunction in the communication circuit 20. Thus, the process shown in FIG. 5 is completed.

At step S5, the monitoring unit 22 determines that there is no sign of malfunction in the communication circuit 20. Thus, the process shown in FIG. 5 is completed.

The monitoring unit 22 may determine that there is a sign of malfunction in the communication circuit 20 when a time period during which the voltage level of the clock signal CLK is kept at H or L is equal to or longer than a time threshold Tth. When the clock signal CLK is normal, the time period during which the clock signal CLK is kept at H or L is half the period of the clock signal CLK. The time threshold Tth can be set to a value obtained by adding a certain margin to half the period of the clock signal CLK. The start of the time period during which the clock signal CLK is kept at H is, for example, a timing at which the monitoring unit 22 detects that the voltage level of the clock signal CLK has transitioned from L to H. The end of the time period during which the clock signal CLK is kept at H is, for example, a timing at which the monitoring unit 22 detects that the voltage level of the clock signal CLK has transitioned from H to L. The start of the time period during which the clock signal CLK is kept at L is, for example, a timing at which the monitoring unit 22 detects that the voltage level of the clock signal CLK has transitioned from H to L. The end of the time period during which the clock signal CLK is kept at L is, for example, a timing at which the monitoring unit 22 detects that the voltage level of the clock signal CLK has transitioned from L to H.

Figure 6:
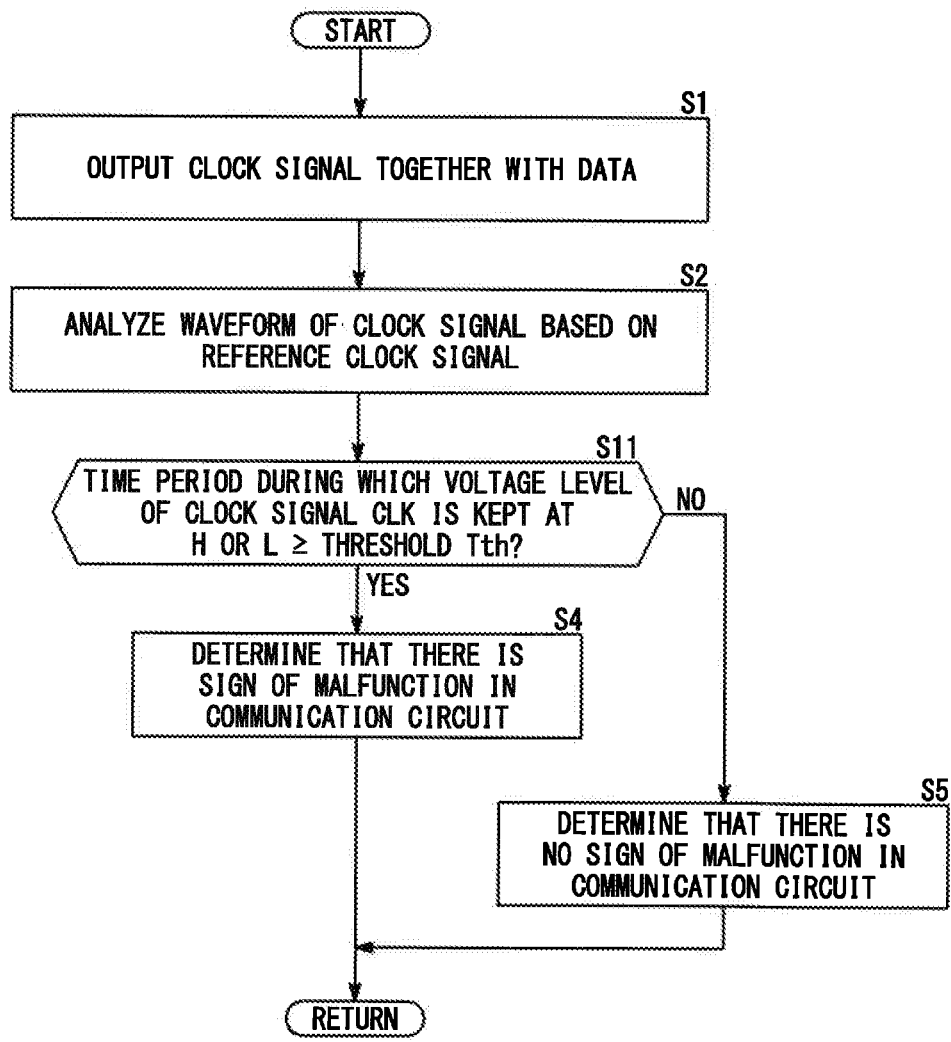
FIG. 6 is a flowchart showing an operational example of a monitoring device according to the embodiment.

An operational example of the monitoring device 24 according to the present embodiment will be described with reference to FIG. 6. FIG. 6 is a flowchart showing an operational example of the monitoring device according to the present embodiment. FIG. 6 shows an example in which it is determined that there is a sign of malfunction in the communication circuit 20 when the time period during which the voltage level of the clock signal CLK is kept at the high level or the low level is equal to or longer than the time threshold Tth.

At step S1, the communication circuit 20 outputs data D according to the clock signal CLK and outputs the clock signal CLK. Step S1 is continuously performed.

At step S2, the monitoring unit 22 analyzes the waveform of the clock signal CLK based on the reference clock signal RCLK. Step S2 is continuously performed.

At step S11, the monitoring unit 22 determines whether or not the time period during which the voltage level of the clock signal CLK is kept at H or L is equal to or longer than the time threshold Tth (i.e., whether the time period Tth). When the time period during which the voltage level of the clock signal CLK is kept at H or L is equal to or longer than the time threshold Tth (YES at step S11), the process proceeds to step S4. When the time period during which the voltage level of the clock signal CLK is kept at H or L is shorter than the time threshold Tth (NO at step S11), the process proceeds to step S5.

At step S4, the monitoring unit 22 determines that there is a sign of malfunction in the communication circuit 20. Thus, the process shown in FIG. 6 is completed.

At step S5, the monitoring unit 22 determines that there is no sign of malfunction in the communication circuit 20. Thus, the process shown in FIG. 6 is completed.

As described theretofore, in the present embodiment, the waveform of the clock signal CLK is analyzed using the predetermined reference clock signal RCLK having the period T2 that is equal to or shorter than the period T1 of the clock signal CLK. When the analyzed waveform of the clock signal CLK is different from the predetermined basic waveform, it is determined that there is a sign of malfunction in the communication circuit 20. Thus, according to the present embodiment, it is possible to advantageously grasp the presence or absence of a sign of malfunction in the communication circuit 20.

(Modification)

Figure 7:
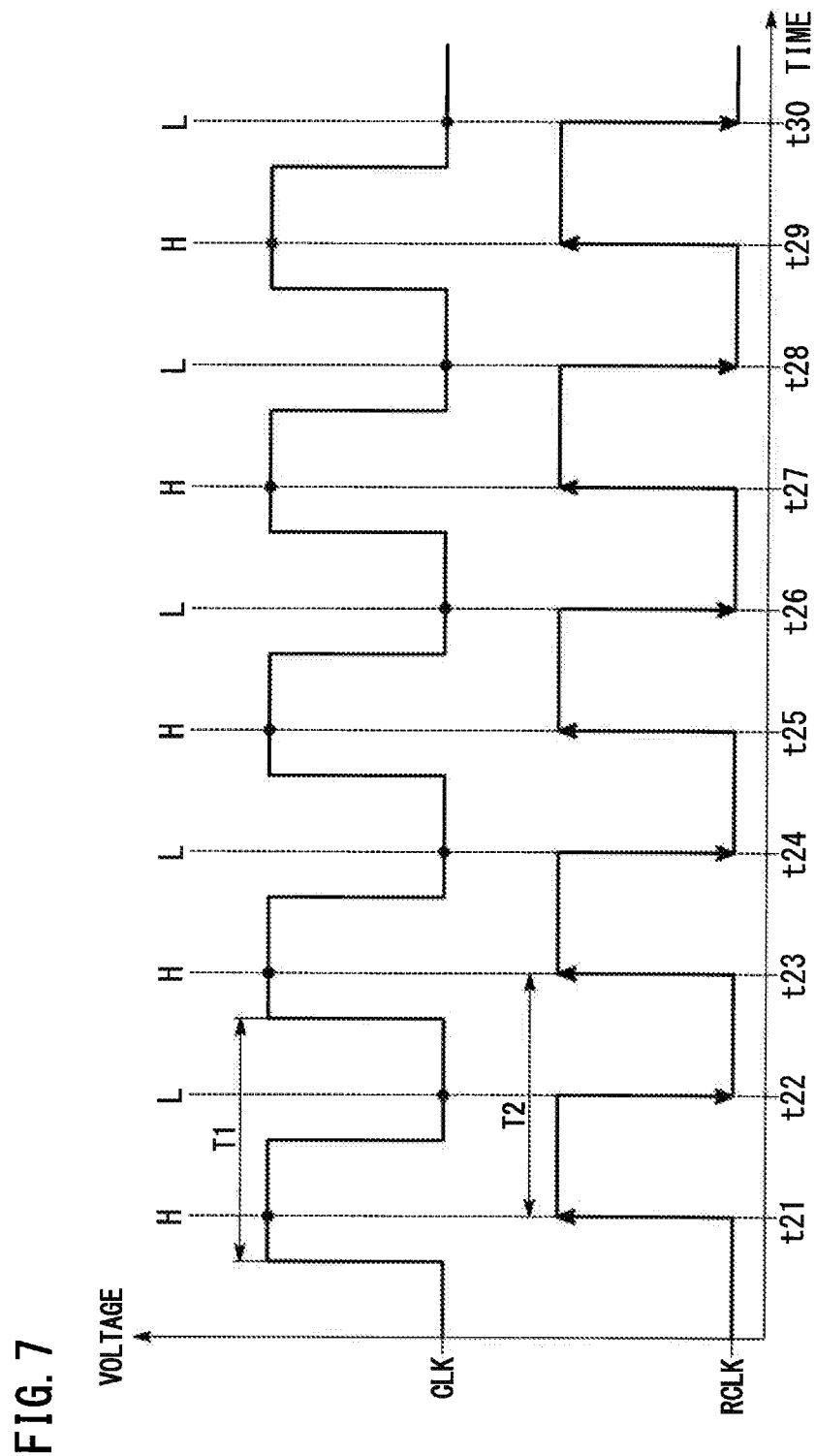
FIG. 7 is a time chart showing a clock signal and a reference clock signal.

A monitoring device according to a modification of this embodiment will be described with reference to FIGS. 7 and 8. FIG. 7 is a time chart showing a clock signal and a reference clock signal.

In this modification, the period T2 of the reference clock signal RCLK is set to be equal to the period T1 of the clock signal CLK. In this modification, the voltage level of the clock signal CLK is observed (detected) at rising timings and falling timings of the reference clock signal RCLK.

As shown in FIG. 7, the reference clock signal RCLK rises at a timing t21. A reference numeral t is used to generally describe the timing, and reference numerals t21, t22, t23, . . . are used to describe individual timings. The monitoring unit 22 observes the voltage level of the clock signal CLK at the timing t21. In the example shown in FIG. 7, the voltage level of the clock signal CLK at the timing t21 is H, that is, the high level.

The reference clock signal RCLK falls at a timing t22, which is a timing occurring half the period ((T2)/2) after the timing t21. The monitoring unit 22 observes the voltage level of the clock signal CLK at the timing t22. In the example shown in FIG. 7, the voltage level of the clock signal CLK at the timing t22 is L, that is, the low level.

The reference clock signal RCLK rises at a timing t23, which is a timing occurring half the period ((T2)/2) after the timing t22. The monitoring unit 22 observes the voltage level of the clock signal CLK at the timing t23. In the example shown in FIG. 7, the voltage level of the clock signal CLK at the timing t23 is H.

The reference clock signal RCLK falls at a timing t24, which is a timing occurring half the period ((T2)/2) after the timing t23. The monitoring unit 22 observes the voltage level of the clock signal CLK at the timing t24. In the example shown in FIG. 7, the voltage level of the clock signal CLK at the timing t24 is L.

The reference clock signal RCLK rises at a timing t25, which is a timing occurring half the period ((T2)/2) after the timing t24. The monitoring unit 22 observes the voltage level of the clock signal CLK at the timing t25. In the example shown in FIG. 7, the voltage level of the clock signal CLK at the timing t25 is H.

Thereafter, the monitoring unit 22 also observes the voltage levels of the clock signal CLK at falling and rising timings t26, t27, t28, t29, and t30 of the reference clock signal RCLK in the same manner as described above. In the example shown in FIG. 7, the voltage levels of the clock signal CLK at the timings t26, t27, t28, t29, and t30 are L, H, L, H, and L.

When the period T2 of the reference clock signal RCLK is equal to the period T1 of the clock signal CLK, the voltage level of the clock signal CLK observed at the rising and falling timings t of the reference clock signal RCLK repeats the above-described cycle of H, L, H, L. When the voltage level of the clock signal CLK sequentially observed at the rising and falling timings t of the reference clock signal RCLK repeats the cycle of H, L, H, L, the monitoring unit 22 can determine that the waveform of the clock signal CLK is the same as the predetermined basic waveform.

As described above, there are cases where the voltage level of the clock signal CLK may be kept at the high level or the low level due to the influence of disturbance noise, the influence of aging deterioration of the communication circuit 20 or the like. FIG. 8 is a time chart showing an example of a state in which the voltage level of the clock signal is kept at the high level due to the influence of disturbance noise or the like. In the example shown in FIG. 8, the observed voltage levels of the clock signal CLK at the timings t21 to t23 are the same as those in the example shown in FIG. 7. However, in the example shown in FIG. 8, the level of the clock signal CLK observed at the timing t24 is H. As described above, in the example shown in FIG. 7, the level of the clock signal CLK observed at the timing t24 is L. Thus, in the example shown in FIG. 8, the level of the clock signal CLK observed at the timing t24 differs from that in the example shown in FIG. 7. The level of the clock signal CLK observed at the timing t24 in the case shown in FIG. 8 becomes different from the case shown in FIG. 7 because of the influence of disturbance noise or the like that occurred during the time period between the timing t23 and the timing t24 in the example shown in FIG. 8. In the example shown in FIG. 8, the voltage levels of the clock signal CLK observed at the timing t25 and thereafter are the same as those in the example shown in FIG. 7.

In the example shown in FIG. 7, the voltage levels of the clock signals CLK observed at the timings t23 and t24 are H and L. On the other hand, in the example shown in FIG.

8, the voltage levels of the clock signals CLK observed at the timings t23 and t24 are H and H. That is, in the example shown in FIG. 8, the waveform of the clock signal CLK is not the same as the predetermined basic waveform. Since the waveform of the clock signal CLK is not the same as the predetermined basic waveform, the monitoring unit 22 determines that there is a sign of malfunction in the communication circuit 20.

In this way, the period T2 of the reference clock signal RCLK may be set to be equal to the period T1 of the clock signal CLK. With this modification, it is possible to preferably grasp the presence or absence of a sign of malfunction in the communication circuit 20.

Though the preferred embodiment of the present invention have been described above, the present invention is not limited to the above embodiment, and various modifications can be made without departing from the gist of the present invention.

For example, the above embodiment has been described by giving an example where the reference clock signal RCLK is supplied from the control unit 16 to the monitoring unit 22, but the present invention is not limited to this. For example, a clock oscillation circuit that generates the reference clock signal RCLK may be provided in the monitoring unit 22.

The above embodiment is summarized as follows.

A monitoring device (24) includes: an acquisition unit (21) configured to acquire a clock signal (CLK) output from a communication circuit (20) that outputs the clock signal; and a monitoring unit (22) configured to analyze the waveform of the clock signal acquired by the acquisition unit, based on a predetermined reference clock signal (RCLK) having a period (T2) equal to or shorter than a period (T1) of the clock signal, and thereby determine whether or not there is a sign of malfunction in the communication circuit. This configuration makes it possible to suitably grasp the presence or absence of a sign of malfunction in the communication circuit.

The monitoring unit may be configured to determine that there is a sign of malfunction in the communication circuit when the analyzed waveform of the clock signal is different from a predetermined basic waveform.

The monitoring unit may be configured to analyze the waveform of the clock signal by observing the voltage level of the clock signal at rising or falling timings of the reference clock signal.

The monitoring unit may be configured to determine that there is a sign of malfunction in the communication circuit when the time period during which the voltage level of the clock signal is kept at the high level or the low level is equal to or longer than a time threshold (Tth).

A motor driving apparatus (10) including the above-described monitoring device, further includes: an inverter (14) configured to supply an electric current to a motor (12); a current detector (18) configured to detect the electric current supplied to the motor; and a control unit (16) configured to control the inverter. The communication circuit is configured to output the clock signal and data (D) corresponding to a detection signal detected by the current detector, to the control unit, and the control unit is configured to output the reference clock signal to the monitoring unit.

A monitoring method includes: an acquisition step (S1) of, with an acquisition unit, acquiring a clock signal output from a communication circuit that outputs the clock signal; and a monitoring step (S2 to S5) of, with a monitoring unit, determining whether or not there is a sign of malfunction in the communication circuit, by analyzing the waveform of the clock signal, based on a predetermined reference clock signal having a period that is equal to or shorter than the period of the clock signal.

The monitoring step may determine that there is a sign of malfunction in the communication circuit when the analyzed waveform of the clock signal is different from a predetermined basic waveform.

The monitoring step may analyze the waveform of the clock signal by observing the voltage level of the clock signal at rising or falling timings of the reference clock signal.

The monitoring step may determine that there is a sign of malfunction in the communication circuit when a time period during which the voltage levels of the clock signal is kept at a high level or a low level is equal to or longer than a time threshold.

The reference clock signal may be supplied from a control unit controlling an inverter that supplies an electric current to a motor, to the monitoring unit.

What is claimed is:

1. A monitoring device, comprising:
   an acquisition unit configured to acquire a clock signal output from a communication circuit that outputs the clock signal; and
   a monitoring unit configured to analyze a waveform of the clock signal acquired by the acquisition unit, based on a predetermined reference clock signal having a period equal to or shorter than a period of the clock signal, and thereby determine whether or not there is a sign of malfunction in the communication circuit.

2. The monitoring device according to claim 1, wherein the monitoring unit is configured to determine that there is a sign of malfunction in the communication circuit when the analyzed waveform of the clock signal is different from a predetermined basic waveform.

3. The monitoring device according to claim 2, wherein the monitoring unit is configured to analyze the waveform of the clock signal by observing voltage level of the clock signal at rising or falling timings of the reference clock signal.

4. The monitoring device according to claim 3, wherein the monitoring unit is configured to determine that there is a sign of malfunction in the communication circuit when a time period during which the voltage level of the clock signal is kept at a high level or a low level is equal to or longer than a time threshold.

5. A motor driving apparatus comprising the monitoring device according to claim 1, further comprising:
   an inverter configured to supply an electric current to a motor;
   a current detector configured to detect the electric current supplied to the motor; and
   a control unit configured to control the inverter, wherein:
   the communication circuit is configured to output the clock signal and data corresponding to a detection signal detected by the current detector, to the control unit; and
   the control unit is configured to output the reference clock signal to the monitoring unit.

6. A monitoring method, comprising:
   an acquisition step of, with an acquisition unit, acquiring a clock signal output from a communication circuit that outputs the clock signal; and
   a monitoring step of, with a monitoring unit, determining whether or not there is a sign of malfunction in the communication circuit, by analyzing a waveform of the clock signal, based on a predetermined reference clock signal having a period that is equal to or shorter than a period of the clock signal.

7. The monitoring method according to claim 6, wherein the monitoring step determines that there is a sign of malfunction in the communication circuit when the analyzed waveform of the clock signal is different from a predetermined basic waveform.

8. The monitoring method according to claim 7, wherein the monitoring step analyzes the waveform of the clock signal by observing voltage level of the clock signal at rising or falling timings of the reference clock signal.

9. The monitoring method according to claim 8, wherein the monitoring step determines that there is a sign of malfunction in the communication circuit when a time period during which the voltage level of the clock signal is kept at a high level or a low level is equal to or longer than a time threshold.

10. The monitoring method according to claim 6, wherein the reference clock signal is supplied from a control unit configured to control an inverter that supplies an electric current to a motor, to the monitoring unit.

* * * * *